United States Patent [19]

Pribyl

[11] Patent Number: 4,933,571
[45] Date of Patent: Jun. 12, 1990

[54] SYNCHRONIZING FLIP-FLOP CIRCUIT CONFIGURATION

[75] Inventor: Wolfgang Pribyl, Ottobrunn, Fed. Rep. of Germany

[73] Assignee: Siemens Aktiengesellschaft, Munich, Fed. Rep. of Germany

[21] Appl. No.: 232,315

[22] Filed: Aug. 15, 1988

[30] Foreign Application Priority Data

Sep. 17, 1987 [DE] Fed. Rep. of Germany ....... 3731294

[51] Int. Cl.[5] .................. H03K 3/284; H03K 3/26
[52] U.S. Cl. ........................ 307/272.1; 307/480; 307/279; 307/452; 307/443
[58] Field of Search ............. 307/272.1, 272.2, 480, 307/269, 279, 451, 452, 453, 289

[56] References Cited

U.S. PATENT DOCUMENTS

| | | | |
|---|---|---|---|
| 3,930,169 | 12/1975 | Kuhn, Jr. .................. | 307/279 X |
| 4,224,531 | 9/1980 | Ebihara et al. ............ | 307/475 X |
| 4,667,339 | 5/1987 | Tubbs et al. .............. | 307/272.2 |
| 4,785,200 | 11/1988 | Huntington ............... | 307/279 |

FOREIGN PATENT DOCUMENTS

0079328 5/1983 Japan ............................ 307/272.2

OTHER PUBLICATIONS

Mead, Carver A. and Lynn A. Conway, "Introduction to VLSI Systems", (Addison-Wesley Publishing Co., Inc. Philippines 1980) 3rd Ed., pp. 236-242.

Primary Examiner—Stanley D. Miller
Assistant Examiner—Timothy P. Callahan
Attorney, Agent, or Firm—Herbert L. Lerner; Laurence A. Greenberg

[57] ABSTRACT

A synchronizing flip-flop circuit configuration for synchronizing data includes an input and an output of the synchronizing flip-flop circuit configuration. A first transfer gate, connected to the input of the synchronizing flip-flop circuit configuration, is controlled by a first clock signal. A second transfer gate connected between the first transfer gate and the output of the synchronizing flip-flop circuit configuration is controlled by a second clock signal being inverted with respect to the first clock signal. A first series-connected inverter pair is connected between the first transfer gate and the output of the synchronizing flip-flop circuit configuration. At least one second inverter series-connected inverter pair is connected in series with the first inverter configuration between the first transfer gate and the output of the synchronizing flip-flop circuit configuration, thereby preventing occurrence of meta-stable conditions between data to be synchronized.

4 Claims, 1 Drawing Sheet

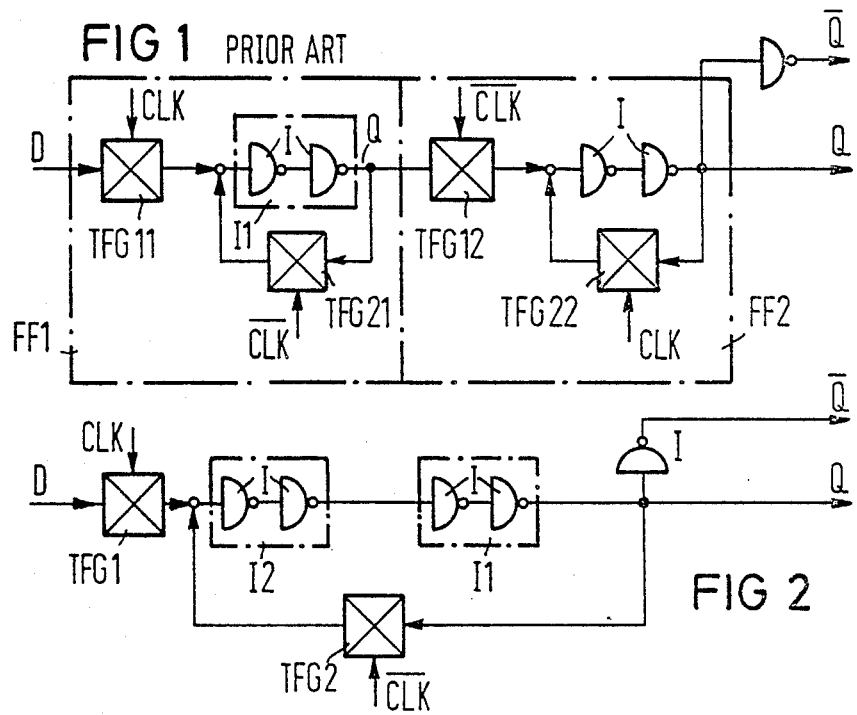
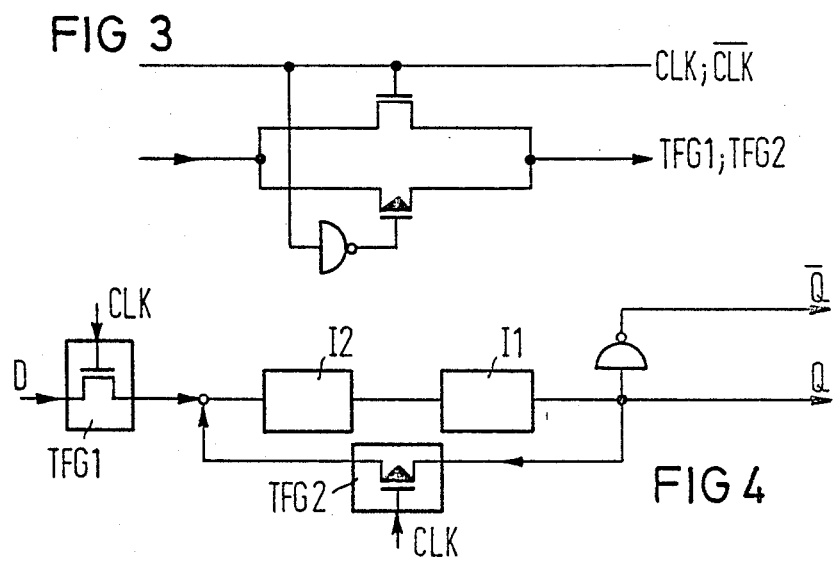

SYNCHRONIZING FLIP-FLOP CIRCUIT CONFIGURATION

The invention relates to a synchronizing flip-flop circuit configuration, including a first transfer gate disposed at the input of the synchronizing flip-flop circuit configuration and controlled by a first clock signal, a first inverter configuration between the first transfer gate and the output of the synchronizing flip-flop circuit configuration, and a second transfer gate also disposed between the first transfer gate and the output of the synchronizing flip-flop circuit configuration and controlled by a second clock signal being inverted with respect to the first clock signal.

Synchronizing flip-flop circuit configurations are used for synchronizing asynchronous data at the input of electrical circuit systems, in particular at the inputs of integrated circuits. An input signal (occurring at an arbitrary and undetermined instant) is transferred into the circuit system at the appearance of a clock signal (internal to the system). Due to the typical finite rise and delay times of electrical signals in electrical technology, so-called metastable, i.e. undefined, conditions occur at the input of the system if the input signal to be transferred into the system has changed in slope prior to the effective edge, lateral surface or flank of the clock signal triggering the transfer, during a period that is shorter than a suitably defined minimum time period. This problem is described in detail in the publication by Mead and Conway, entitled *Introduction to VLSI-Systems*, 3rd Edition, 1980, pp. 236 to 242.

Customary synchronizing flip-flop circuit configurations for minimizing the minimum time period referred to above may, for example, provide for repeated cascading of complete flip-flop stages containing several inverter and transfer gates, for example. One conventional two-fold cascade contains a first flip-flop configuration having two inverters, a transfer gate for transferring an input signal at the input as well as a further transfer gate for feedback. A second flip-flop configuration which is internally constructed like the first flip-flop configuration, is cascaded in series with the latter and is controlled by clock signals which are complementary to the corresponding clock signals of the first flip-flop configuration.

The disadvantage of such a cascading principle is the occurrence of an associated phase delay having a value of one-half clock period per each cascade step connected in series following the first flip-flop configuration.

It is accordingly an object of the invention to provide a synchronizing flip-flop circuit configuration which overcomes the hereinafore-mentioned disadvantages of the heretofore-known devices of this general type and which permits the minimization of the minimum time period referred to above, without the aforementioned phase delay.

With the foregoing and other objects in view there is provided, in accordance with the invention, a synchronizing flip-flop circuit configuration, comprising an input and an output of the synchronizing flip-flop circuit configuration, a first transfer gate connected to the input of the synchronizing flip-flop circuit configuration and controlled by a first clock signal, a second transfer gate connected between the first transfer gate and the output of the synchronizing flip-flop circuit configuration and controlled by a second clock signal being inverted with respect to the first clock signal, a first inverter configuration connected between the first transfer gate and the output of the synchronizing flip-flop circuit configuration, and at least one second inverter configuration connected in series with the first inverter configuration between the first transfer gate and the output of the synchronizing flip-flop circuit configuration.

In accordance with another feature of the invention, the inverter configurations contain CMOS inverters.

In accordance with a further feature of the invention, at least one of the transfer gates has two channels and transistors of a type being complementary to each other.

In accordance with a concomitant feature of the invention, the first transfer gate contains n-channel transistors, and the second transfer gate contains p-channel transistors and is controlled by the first clock signal instead of the second clock signal.

Other features which are considered as characteristic for the invention are set forth in the appended claims.

Although the invention is illustrated and described herein as embodied in a synchronizing flip-flop circuit configuration, it is nevertheless not intended to be limited to the details shown, since various modifications and structural changes may be made therein without departing from the spirit of the invention and within the scope and range of equivalents of the claims. The construction and method of operation of the invention, however, together with additional objects and advantages thereof will be best understood from the following description of specific embodiments when read in connection with the accompanying drawings.

FIG. 1 is a schematic circuit diagram of a synchronizing flip-flop circuit configuration according to the state of the art as described above; and FIGS. 2 to 4 are circuit diagrams of embodiments of the invention.

Referring now to the figures of the drawings in detail and first, particularly, to FIG. 1 thereof, there is seen a prior art synchronizing flip-flop circuit for minimizing the minimum time period referred to above which may provide for repeated cascading of complete flip-flop stages that may contain several inverter and transfer gates. A two-fold cascade is shown in FIG. 1 as an example. A first flip-flop configuration FF1 contains a pair of series-connected inverters I, a transfer gate TFG11 for transferring an input signal at an input D, as well as a further transfer gate TFG21 for feedback. A second flip-flop configuration FF2 that has been internally constructed in the same way as the first flip-flop configuration FF1, has been cascaded in series with the first flip-flop configuration FF1. The second flip-flop configuration FF2 is controlled by clock signals $\overline{CLK}$, CLK which are complementary to corresponding clock signals CLK, $\overline{CLK}$ of the first flip-flop configuration FF1.

As mentioned above, the disadvantage of the type of cascading shown in FIG. 1 is the occurrence of an associated phase delay having a value of one-half clock period per each cascade step such as FF2 etc., which is connected in series following the first flip-flop configuration FF1.

The synchronizing flip-flop circuit configuration according to the invention as shown in FIG. 2 contains a first transfer gate TFG1. The first transfer gate TFG1 is disposed at the input D of the synchronizing flip-flop circuit configuration and is controlled by a first clock signal CLK. The control can be carried out in such a way that an input signal applied to the input D is transferred, for instance in the HIGH state of the first clock signal CLK. Transfer in the LOW state is also conceivable as an alternative and a circuit designer has a free choice in this regard.

In accordance with the invention, a first series-connected inverter pair I1 and a second inverter pair I2 are provided between the first transfer gate TFG1 and an output Q of the synchronizing flip-flop circuit configuration. While the first series-connected inverter pair I1 is also provided in a flip-flop circuit configuration in accordance with the state of the art as seen FIG. 1, the second series-connected inverter pair I2 is novel. On one hand, this leads to good amplification with steep slopes of the input signal and on the other hand it leads to a definite increase of the bandwidth at the input of the synchronizing flip-flop circuit configuration, which considerably shortens the previously mentioned minimum time period within which metastable conditions can arise. This means that the probability of metastable conditions arising is also considerably reduced.

A second transfer gate TFG2 is connected in parallel with the two series-connected inverter pairs I1, I2 between the first transfer gate TFG1 and the output Q of the circuit configuration. In this way, the output signal present at the output Q of the circuit configuration is fed back to the series-connected inverter pairs I1, I2. The second transfer gate TFG2 is controlled by a second clock signal $\overline{CLK}$ which is inverted as compared to the first clock signal CLK.

Operation of the synchronizing flip-flop circuit configuration is easily described. The first clock signal CLK causes the input signal applied to the input D to be transferred through the first transfer gate TFG1, while the second transfer gate TFG2 is blocked by the second clock signal $\overline{CLK}$. Subsequently, the input signal is repeatedly inverted through the at least two series-connected inverter pairs I1, I2 and amplified in the process. In this form it is first supplied to the output Q and then through an inverter I to another output $\overline{Q}$ which has a signal sequence that is inverted as compared to the output Q, as is customary with flip-flops.

The hold function of the synchronizing flip-flop circuit configuration is attained by the feed-back effect of the second transfer gate TFG2 While the first clock signal CLK decouples the synchronizing flip-flop circuit configuration from the input D by means of the first transfer gate TFG1, the output signal supplied to the output Q is fed back to the series-connected inverter pair I1, I2 by means of the second transfer gate TFG2, which is controlled by the second clock signal $\overline{CLK}$. Due to the advantageous combination of at least two series-connected inverter pairs I1, I2 with the feedback loop containing the second transfer gate TFG2 within a single synchronizing flip-flop circuit configuration, the advantageous effect of the invention is achieved. This effect is a lessening of the danger of the occurrence of metastable conditions, without the loss of clock cycles.

If the two above-described series-connected inverter pairs I1, I2 are supplemented by additional inverters, the danger of the occurrence of metastable conditions can be further reduced.

It is unimportant from the point of view of the principle underlying the circuit whether the novel series-connected inverter pair I2 (or further series-connected inverter pair) according to the invention is disposed ahead of the series-connected inverter pair I1 which is already present in the state of the art, as shown in the embodiment according to FIG. 2, or after it. However, it is particularly advantageous to construct the individual series-connected inverter pairs I1, I2 using CMOS technology. As is generally known, CMOS inverters have particularly steep transfer characteristic curves, which further decreases the probability of the occurrence of metastable conditions.

It is also advantageous to construct the transfer gates TFG1, TFG2 with two channels and with transistors of types that are complementary to each other (CMOS transistors), as shown in FIG. 3. According to FIG. 3, two transistors are advantageously connected in parallel. This permits high switching speeds and level stability. However, care should be taken to control the gates of both transistors with clock signals that are complementary to each other (CLK and $\overline{CLK}$ at the first transfer gate TFG1; $\overline{CLK}$ and CLK at the second transfer gate TFG2).

FIG. 4 shows a further advantageous embodiment in which the first transfer gate TFG1 contains an n-channel transistor which is controlled by the first clock signal CLK. The second transfer gate TFG2 contains a p-channel transistor which is also controlled by the first clock signal CLK. This configuration not only permits the second clock signal $\overline{CLK}$ to be omitted, but the two transfer gates TFG1, TFG2 still operate in the push-pull mode.

I claim:

1. Synchronizing flip-flop circuit configuration having an input connected to a data signal and an output, comprising a first transfer gate having an input connected to said data signal, and an output, a clock signal controlling said first transfer gate and an inverted clock signal complementary to said clock signal, a first pair of series-connected inverters connected between said first transfer gate output and said output of the synchronizing flip-flop circuit configuration, a second transfer gate connected between said first transfer gate output and said output of the synchronizing flip-flop circuit configuration controlled by said inverted clock signal, and at least one further pair of series-connected inverters connected between said first transfer gate output and said output of the synchronizing flip-flop circuit configuration in series with said first pair of series-connected inverters.

2. Synchronizing flip-flop circuit configuration according to claim 1, wherein said inverter pairs contain CMOS inverters.

3. Synchronizing flip-flop circuit configuration according to claim 1, wherein at least one of said transfer gates has two parallel channels each channel including transistors of a conductivity type being complementary to each other.

4. Synchronizing flip-flop circuit configuration having an input connected to a data signal and an output, comprising a first transfer gate having an input connected to said data signal, and an output, a first pair of series-connected inverters connected between said first transfer gate output and said output of the synchronizing flip-flop circuit configuration, a second transfer gate connected between said first transfer gate output and said output of the synchronizing flip-flop circuit configuration, a clock signal controlling said first and second transfer gate, at least one further pair of series-connected inverters connected between said first transfer gate output and said output of the synchronizing flip-flop circuit configuration in series with said first pair of series-connected inverters; and wherein said first transfer gate contains transistors of only one conductivity type, and said second transfer gate contains transistors of only opposite conductivity type.

* * * * *